United States Patent
May (10) Patent No.: US 9,608,681 B1
(45) Date of Patent: Mar. 28, 2017

(54) OUTPUT DRIVER ARCHITECTURE WITH LOW SPUR NOISE

(71) Applicant: Silicon Laboratories Inc., Austin, TX (US)

(72) Inventor: Michael R. May, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/868,473

(22) Filed: Sep. 29, 2015

(51) Int. Cl.
*H03D 1/04* (2006.01)
*H04B 1/10* (2006.01)
*H03H 11/12* (2006.01)
*H03H 11/04* (2006.01)

(52) U.S. Cl.
CPC ....... *H04B 1/1036* (2013.01); *H03H 11/0405* (2013.01); *H03H 11/12* (2013.01)

(58) Field of Classification Search
CPC .......... H04B 1/1036; H04B 2001/1045; H04B 1/1081; H03H 11/12; H03H 11/1204; H03H 11/1213; H03H 11/1217; H03H 11/0405
USPC .............. 375/316, 346–350; 455/63.1, 67.13
See application file for complete search history.

(56) References Cited

U.S. PATENT DOCUMENTS

| | | | | |
|---|---|---|---|---|
| 4,344,150 A | * | 8/1982 | McLaughlin | H03H 17/0289 708/310 |
| 5,864,591 A | * | 1/1999 | Holcombe | H04B 10/11 375/345 |
| 6,353,647 B1 | * | 3/2002 | Wilhelmsson | H03L 7/093 327/156 |
| 2005/0036562 A1 | | 2/2005 | Ranganathan et al. | |
| 2010/0045376 A1 | * | 2/2010 | Soenen | H03F 3/2173 330/251 |
| 2010/0066404 A1 | * | 3/2010 | Zhang | H03K 19/0005 326/30 |
| 2010/0109647 A1 | | 5/2010 | Uematsu et al. | |
| 2010/0130156 A1 | * | 5/2010 | Jin | H04B 1/30 455/296 |
| 2011/0089576 A1 | | 4/2011 | Choi et al. | |
| 2012/0212288 A1 | * | 8/2012 | Masui | H03H 11/0427 327/557 |
| 2013/0021183 A1 | * | 1/2013 | Ashburn, Jr. | H03M 3/368 341/143 |
| 2013/0088276 A1 | | 4/2013 | Seth et al. | |
| 2015/0180430 A1 | * | 6/2015 | Wang | H03F 3/217 381/120 |

OTHER PUBLICATIONS

Wikipedia.org, "Sallen—Key Topology," downloaded Aug. 25, 2015, 8 pages.
Silicon Labs, "Si4736/7/8/9 Broadcast AM/FM/WB Radio Receiver," Jan. 7, 2008, 2 pages.

* cited by examiner

*Primary Examiner* — Khanh C Tran
(74) *Attorney, Agent, or Firm* — Trop, Pruner & Hu, P.C.

(57) ABSTRACT

In one embodiment, an integrated circuit includes: a first input pad to receive a radio frequency (RF) signal; a radio receiver to process the RF signal and output a digitally processed signal; an analog filter to receive a digital signal via an input signal path and output a drive signal via an output signal path; and a first output pad coupled to the output signal path to output a filtered digital signal based on the drive signal.

19 Claims, 6 Drawing Sheets

OUTPUT DRIVER ARCHITECTURE WITH LOW SPUR NOISE

BACKGROUND

In certain integrated circuits (ICs), the presence of input and output signal paths in proximity to each other can create noise problems. For example, a digital pad driver may create radio frequency (RF) energy that couples to an input signal path, such as an RF input signal path. This energy can degrade RF performance of the IC, which may include a radio receiver that receives and processes an incoming RF signal. This incoming RF signal may be interfered with by way of this RF energy. Current solutions to this problem are ineffective, from cost and space considerations.

SUMMARY OF THE INVENTION

In one aspect, an apparatus comprises: a filter to receive an input signal via a first input signal path and output a driving signal via an output signal path, the filter having a feedback input coupled to the output signal path; and a digital output pad coupled to the output signal path to output a filtered signal, the filtered signal comprising a digital signal.

In an example, the apparatus further includes a first input pad to receive a radio frequency (RF) signal and to provide the RF signal to a signal processing path, the filter to reduce coupling of an impulse current of the filtered signal into the first input pad. The apparatus may prevent the filtered signal from rail-to-rail swinging. In an example, the filter comprises an operational amplifier and a low pass filter. This filter may include a feedback loop having: a first capacitor coupled between an output of the filter and a first input terminal of the filter; a first resistor coupled to a second resistor at a first node, the second resistor coupled to the first input terminal of the filter, and a third resistor coupled between the output of the filter and the first node; and a second capacitor coupled between the first node and a reference voltage node. In an example, a smoothing circuit may condition the input signal and provide the conditioned input signal to the filter.

In an example, the apparatus may further include an output stage coupled to the filter. As an example, this output stage comprises: a first metal oxide semiconductor field effect transistor (MOSFET) having a gate terminal to receive the driving signal and a second terminal to output the filtered signal; and a second MOSFET having a gate terminal to receive a control signal and a second terminal coupled to the second terminal of the first MOSFET. A control circuit may be configured to generate the control signal, based on at least one or more of an output current of the output stage and the filtered signal at the gate terminal of the first MOSFET, to maintain the output current of the output stage at a predetermined level and/or to limit a current flow through the second MOSFET, responsive to the output current of the output stage being greater than a predetermined threshold.

In another aspect, an integrated circuit comprises: a driver to drive a digital output pad, the driver including an active filter having a first input to receive an input signal, a second input to couple to a reference voltage level, and an output to output a drive signal; an output stage including a first device and a complementary device, the output stage coupled to receive the drive signal and based at least in part thereon, to output a filtered signal to the digital output pad; a conductive path to couple the output stage to the digital output pad; and a control circuit to limit shoot-through current in the output stage.

In an example, the control circuit is to generate a control signal to control the complementary device to limit the shoot-through current in the output stage. The first input of the active filter may further comprise a feedback input to receive the filtered signal as a feedback signal. The active filter may comprise an operational amplifier having the first input and the second input. The integrated circuit may include a radio frequency input to receive radio frequency signals.

In yet another aspect, a system comprises: a first integrated circuit (IC) including: a first input pad to receive a RF signal; a radio receiver to process the RF signal and output a digitally processed signal; an analog filter to receive a digital signal via an input signal path and output a drive signal via an output signal path, the analog filter having a feedback loop coupled between the output signal path and the input signal path; and a first output pad coupled to the output signal path to output a filtered digital signal based on the drive signal.

In an example, the system may further include: a second IC to receive and process the digitally processed signal; and a circuit board having the first IC and the second IC adapted thereto. The circuit board may have a trace to directly couple the first output pad of the first IC to an input pad of the second IC without interposition of a buffer.

In an example, the first IC may further include: an output stage coupled to the analog filter to receive the drive signal and output the filtered digital signal; and a control circuit coupled to the output stage to control the filtered digital signal from substantially reaching either a power supply voltage level or a ground voltage level. In an example, the analog filter may substantially reduce frequency content of the digital signal in a frequency band of the RF signal.

DETAILED DESCRIPTION

Figure 1:
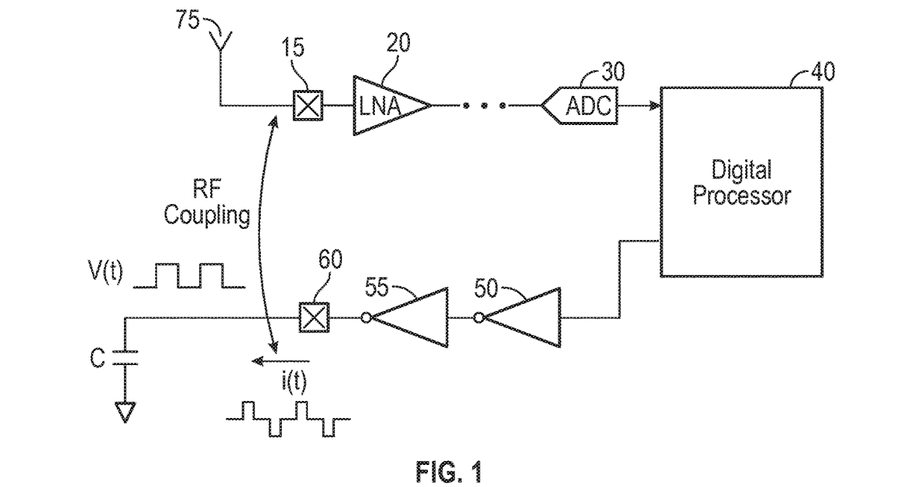
FIG. 1 is a block diagram of a portion of an integrated circuit.

Referring now to FIG. 1, shown is a block diagram of a portion of an integrated circuit. As shown in FIG. 1, IC 10 may be a given type of processing circuit. In the specific embodiment shown, assume that IC 10 includes a radio receiver configured to receive and process an RF signal received via an antenna 75. As seen, the incoming RF signal, which as examples may be an AM/FM/DAB or other terrestrial or satellite RF signal, is received via an input pad 15, which may be a pad of a socket of the integrated circuit that in turn couples to a low noise amplifier (LNA) 20. In one embodiment, this coupling between input pad 15 and LNA 20 may be implemented at least in part by way of a bond wire that couples pad 15 to a die of IC 10. After amplification in LNA 20 and other analog signal processing, a downconverted RF signal is converted in an analog-to-digital converter (ADC) 30 and is provided to a digital processor 40, which may perform various digital processing, additional audio processing and so forth.

As further illustrated, digital processor 40 may also cause signals to be output from IC 10. In this regard, such signals may be output via an output path including inverters 50 and 55, at least the second of which may act as an output driver to drive a digital value to a digital output pad 60 (to which it may be coupled, at least in part via a bond wire). In turn, this signal may be provided to other circuitry, e.g., adapted on a circuit board with IC 10, represented as a load capacitance C.

As one example, assume that this output signal is a digital output clock signal v(t), e.g., operating at a frequency of 37 MHz and having an alternating pattern of high and low (logic 1 and 0) values. This waveform v(t) has harmonic content due to the fast edges. In addition, the current waveform i(t) also has high harmonic content and may magnetically couple as a source of RF energy into input pad 15.

Figure 2A:
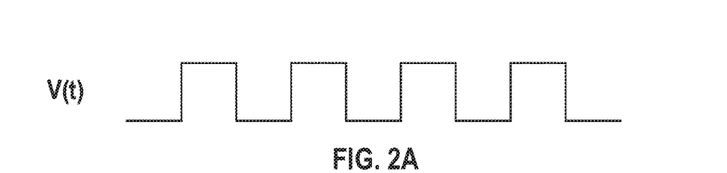
FIGS. 2A-2C are illustrations of digital voltage and current interferers in an integrated circuit environment.
Figure 2B:
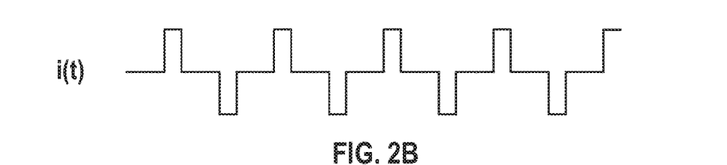
Figure 2C:
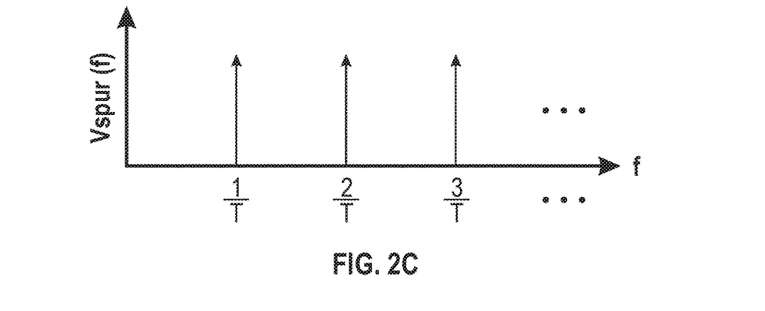

This circuit arrangement can cause RF interference as illustrated further in FIGS. 2A-2C. Specifically FIG. 2A shows a graphical illustration of a clock source to be output from an integrated circuit as v(t). Due to the speed and shape of the edges, these edges induce a current waveform i(t), shown in FIG. 2B. In turn, this current can cause harmonic content to be delivered as noise, Vspur(f), in the frequency domain as shown in FIG. 2C, which is introduced into circuitry of an IC by way of an input pad. Depending upon a given RF signal desired to be processed within the circuit, this harmonic energy (e.g., at frequencies 1/T, 2/T, 3/T, etc.) as shown in FIG. 2C may be present within a desired channel or close to a desired channel, which can create interference that undesirably impacts the RF signal.

Embodiments described herein provide a filter technique to filter outgoing signals that are driven to one or more digital output pads of an integrated circuit. Although embodiments are not limited in this regard, in one example a second-order active filter may be used to provide filtering of a signal being provided to an output pad.

Figure 3:
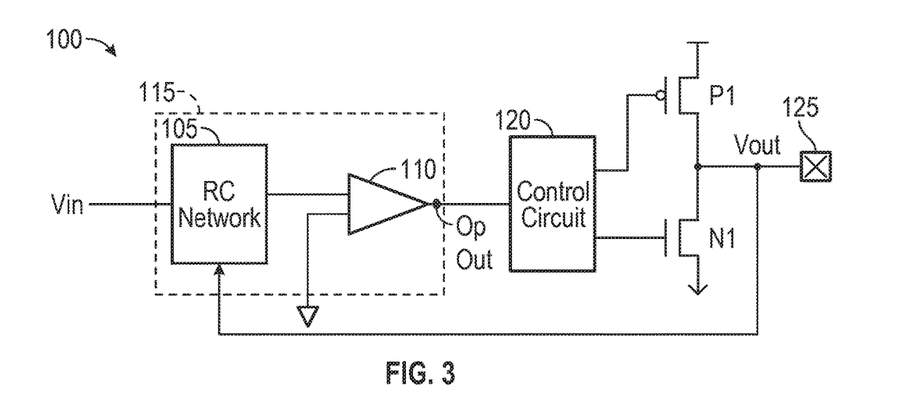
FIG. 3 is a block diagram of a high level view of a circuit arrangement in accordance with one embodiment.

Referring now to FIG. 3, shown is a block diagram of a high level view of a circuit arrangement in accordance with an embodiment. As shown in FIG. 3, circuit 100 may be used to provide a low interference output signal to an output pad 125, which in an embodiment may be a digital output pad of an IC socket that is to output a digital signal. As an example, this digital signal may be an on-chip generated clock signal that is to be provided to other circuitry of a circuit board. However, understand that the digital output signal can be any type of signal in a given system, such as I²S audio clock, frame sync and data, I²C control signals, or digitized signal data, as examples.

As seen in FIG. 3, an incoming signal Vin is provided to a filter 115. In the embodiment shown, filter 115 is a generic second-order active filter having an RC network 105 and an operational amplifier (opamp) 110. As such, filter 115 is configured to provide gain and receive feedback. The resulting filtered signal (output as OpOut from opamp 110) is provided to a control circuit 120 and in turn through an output stage including a pair of metal oxide semiconductor field effect transistors (MOSFETs), more specifically a P-channel MOSFET (PMOS) P1 and an N-channel MOSFET (NMOS) N1. As seen, control circuit 120 drives these output devices that have commonly coupled drain terminals to output the filtered output signal, Vout, corresponding to a filtered version of Vin. As further seen, this filtered output signal is provided in feedback to filter 115. In this arrangement, the output signal Vout can be controlled such that the signal does not extend rail-to-rail. That is, instead of a conventional digital output pad that outputs a signal that swings between rails (e.g., $+V_{DD}$ and 0V), Vout does not swing in either direction to its maximum level and may be controlled to be prevented from substantially reaching the rail levels (e.g., the output signal may be limited to the range between 10% of the supply voltage to 90% of the supply voltage). This limited swing has the advantage that the feedback circuit will stay active and produce a cleanly filtered signal. If the signal extends the full range to the supply or ground, then the feedback circuit is prevented from acting effectively, and the filtering performance of the circuit is compromised. As will be described herein, control circuit 120 may take various forms, and may be used to provide current limiting by control of the output stage devices N1 and P1 such that the arrangement can operate with low power consumption.

Figure 4:
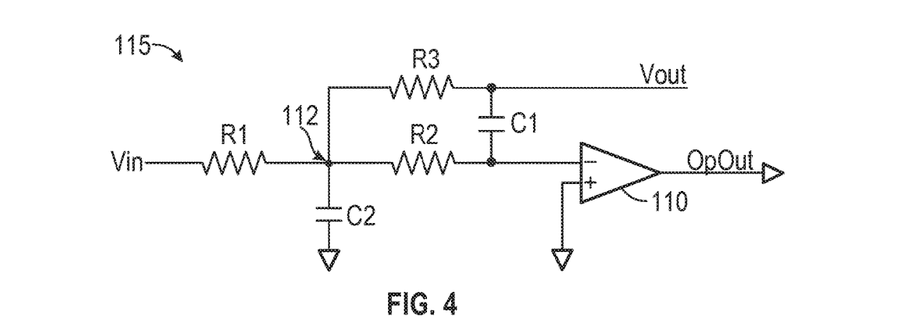
FIG. 4 is a schematic diagram of an active filter in accordance with one embodiment.

Referring now to FIG. 4, shown is a schematic diagram of an active filter in accordance with an embodiment. As described above, active filter 115 can take many different forms. In the implementation shown in FIG. 4, filter 115 is a Sallen-Key filter, as is commonly known in the literature. Filter 115 provides gain and feedback. As seen, an incoming signal Vin is provided to an inverting input of opamp 110 by way of series-coupled resistors R1 and R2. Capacitor C1 is coupled to a feedback input, which receives a feedback signal (Vout, obtained as shown, e.g., in FIG. 3), and is further coupled to the inverting input terminal of opamp 110. As further shown, another resistor R3 couples between an inter-resistor node 112 and the feedback input. In addition, another capacitor C2 couples to inter-resistor node 112 and a reference voltage level (e.g., a ground level). This reference voltage level also couples to the non-inverting input of filter 110. In turn, opamp 110 outputs a filtered signal, OpOut.

Figure 5:
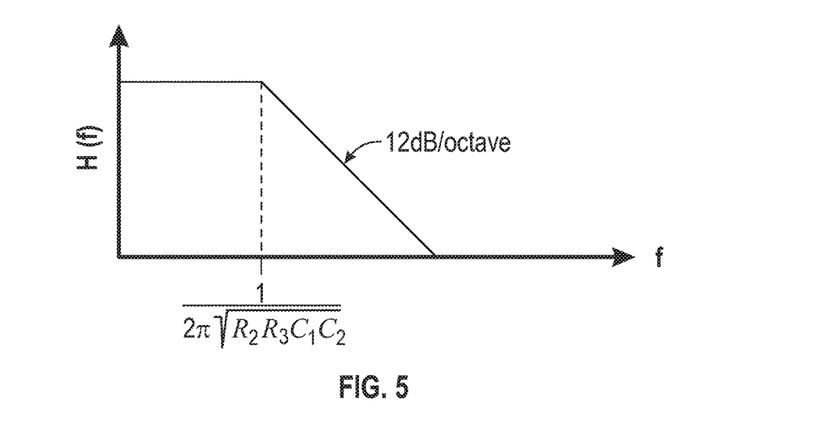
FIG. 5 is a transfer function of a filter in accordance with one embodiment.

In the arrangement of FIG. 4, the gain can be controlled by controlling the values of the RC network. Although a filter as in FIG. 4 can be configured for any of low pass, high pass and bandpass operation by control of the passive component values, given the expected frequency of the digital output signal, filter 115 can be implemented as a low pass filter having the transfer function shown in FIG. 5, in which frequency falls off by 12 decibels (dB) per octave (such that signals beyond the cutoff frequency are attenuated by a factor of four). In the embodiment of FIG. 5, the transfer function is according to:

$$H(f) = 1/2\pi \frac{1}{\sqrt{R_2 R_3 C_1 C_2}},$$

and the gain of the circuit is R3/R1.

Figure 6:
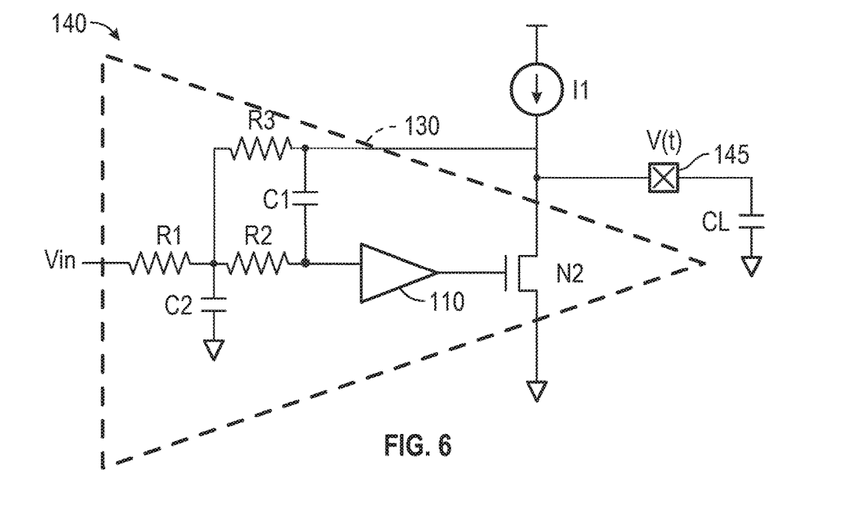
FIG. 6 is a schematic diagram of incorporation of a second-order filter into an output pad driver in accordance with an embodiment.

Referring now to FIG. 6, shown is a schematic diagram of incorporation of a second-order filter into an output pad driver in accordance with an embodiment. As shown in FIG. 6, circuit 140 includes an output pad driver 130 having opamp 110 arranged in a Sallen-Key filter structure with an RC network formed of resistors R1/R2/R3 and capacitors C1/C2. The output of opamp 110 gates an NMOS N2 that provide a filtered output signal via its drain terminal in turn coupled to an output pad 145. Note the presence of a current source I1, also coupled to this drain terminal. Assuming an oscillating input voltage, such as a sine wave having a frequency of, e.g., 37 megahertz (MHz) and further assuming a nominal load capacitance (e.g., 60 picoFarads), this circuit may consume approximately 10 millamperes (mA) of current and further may consume this peak amount during all operation. Assuming that a given IC may include many digital output pads each to have a filter coupled as described herein, an undesirably large amount of current consumption would occur. As such, embodiments may provide further control techniques and circuitry to reduce current consumption within this filter design. Different manners of reducing current consumption can be realized, as will be described.

Figure 7:
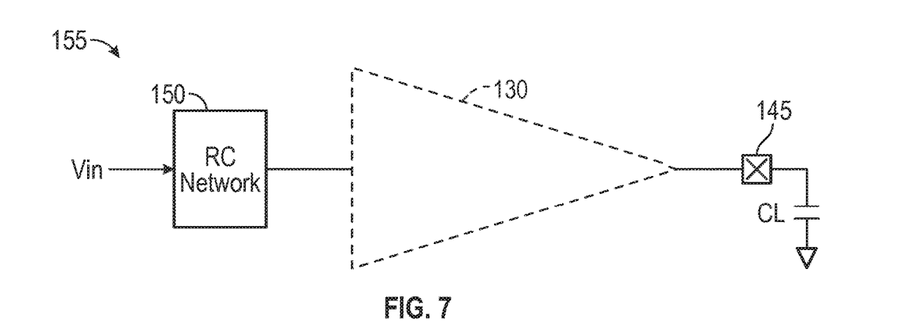
FIG. 7 is a block diagram of another circuit in accordance with an embodiment.

Still further, embodiments may provide for improved circuit performance by generating a smooth edge as an input to the filter. Referring now to FIG. 7, shown is a block diagram of another circuit in accordance with an embodiment. As shown in FIG. 7, an RC network 150 may be coupled to receive the incoming signal Vin and smooth the edges before providing it to pad driver 130.

Figure 8:
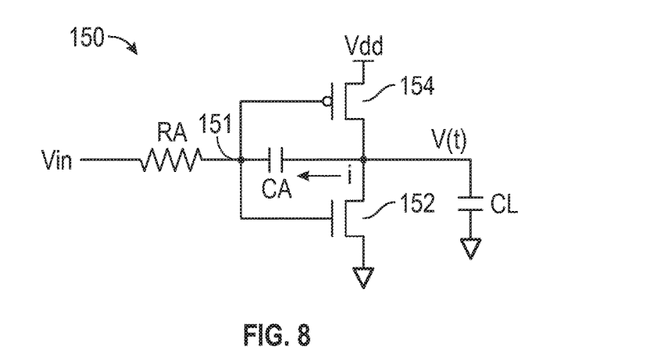
FIG. 8 is a schematic diagram of a RC network in accordance with an embodiment.

Different manners of smoothing the edges can be realized in different embodiments. In one particular case, this RC network can be expanded as shown in FIG. 8. Specifically, circuit 150 shown in FIG. 8 limits the slope of the output waveform V(t) (to be output to the pad driver). In this circuit, the incoming signal Vin is coupled through series-coupled resistor RA and capacitor CA. An inter-device node 151 is coupled to the gate terminals of NMOS 152 and PMOS 154. In turn, the commonly coupled drain terminals of these transistors provide an output signal (V(t)) that couples to a load CL. As V(t) changes, the current through CA is according to:

$$i = \frac{dv(t)}{dt} \cdot CA.$$

In this arrangement, resistor RA limits the amount of current that can be driven through CA so the maximum current though CA is $$i_{max} = \frac{Vdd}{RA}.$$

As the current through CA is a function of the output slope, $$i = CA\frac{dv(t)}{dt}.$$

At maximum:

$$\frac{Vdd}{RA} = CA\frac{dv(t)}{dt},$$

which may be expressed as:

$$\frac{dv(t)}{dt} = \frac{Vdd}{RACA}.$$

Thus circuit 150 acts to limit the slope of the voltage on the output waveform. This limits high frequency content of the output current. Note that this input smoothing circuit 150 may or may not be present in particular implementations and further understand that another type of smoothing circuit may be present in other embodiments to condition the input signal prior to input into a filter circuit as described herein. Understand also that some embodiments may provide further improvement for high performance circuits by further control techniques.

Figure 9A:
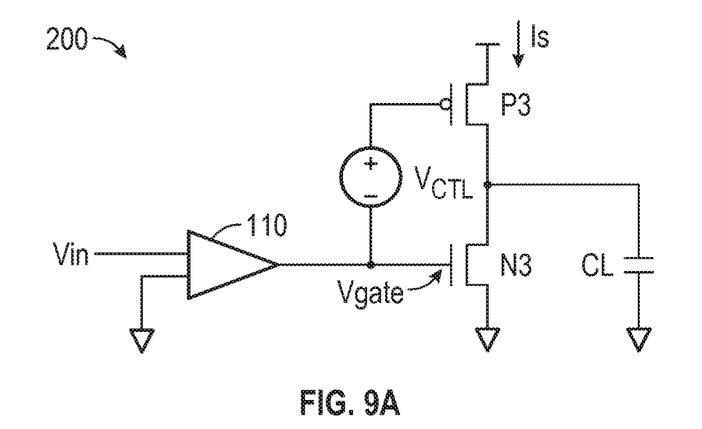
FIG. 9A is a schematic diagram of another output circuit in accordance with an embodiment.

Referring now to FIG. 9A, shown is a schematic diagram of another output circuit in accordance with an embodiment. As shown in FIG. 9A, circuit 200 generally includes an opamp 110 as part of an active filter structure. Note that for ease of illustration, the RC components are not shown (but may be arranged as previously described). As seen, the output of opamp 110 provides a drive voltage (Vgate) that is coupled to a gate terminal of an NMOS N3 via an output line. As further illustrated, a voltage source Vctl couples between this output line and a gate terminal of a PMOS P3. The commonly coupled drain terminals of output stage devices P3/N3 provide the filtered output signal to an output load, represented by CL. Without proper control of the MOSFETs, an undesired amount of shoot-through current Is may be consumed in these output devices. The circuit in FIG. 9A acts to keep both N3 and P3 from strongly conducting current at the same time.

Figure 9B:
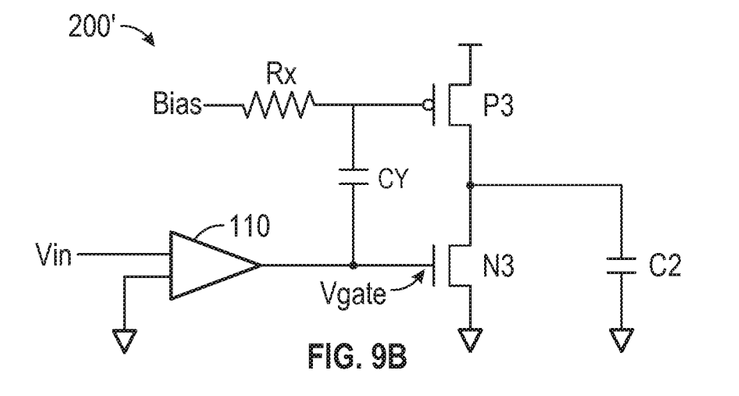
FIG. 9B is a schematic diagram of another output circuit in accordance with another embodiment.

Referring now to FIG. 9B, shown is a schematic diagram of another output circuit in accordance with another embodiment. As shown in FIG. 9B, circuit 200' generally takes the same form as circuit 200 of FIG. 9A. However here note that the Vgate output of opamp 110 couples to an RC circuit formed of capacitor Cy, coupled to the gate terminals of NMOS N3 and PMOS P3 and the output of opamp 110, and resistor Rx, coupled between a bias source and the gate terminal of PMOS P3. This RC circuit thus is one example of a control circuit that takes the place of voltage source Vctl (of FIG. 9A) to provide a controllable voltage that may be used to gate PMOS P3.

Figure 10:
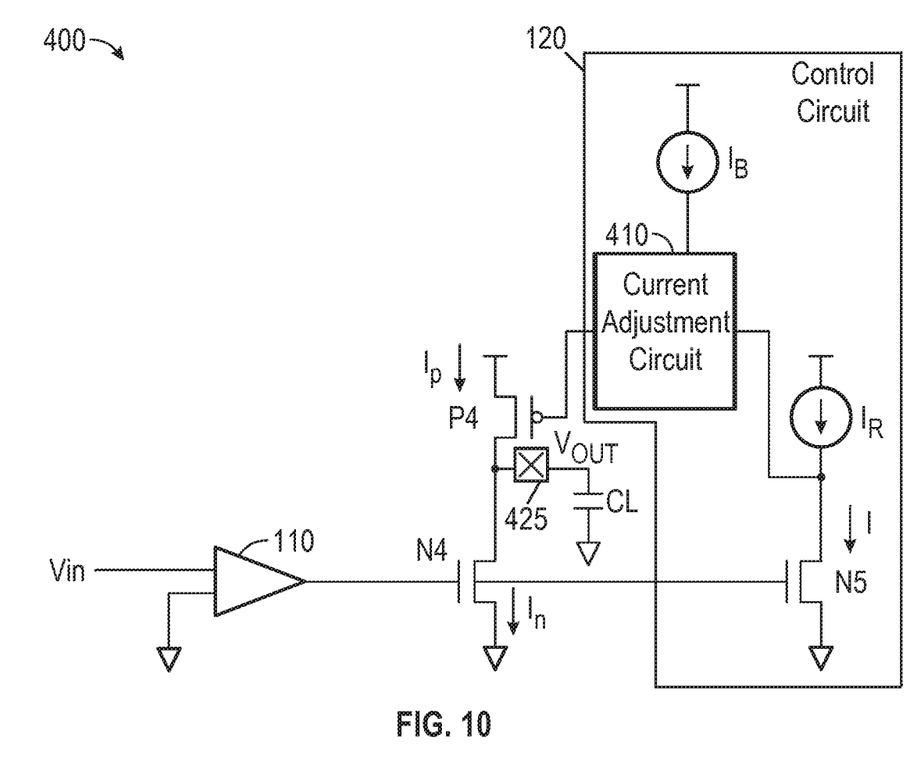
FIG. 10 is a schematic diagram of another circuit in accordance with an embodiment.

Referring now to FIG. 10, shown is a schematic diagram of another circuit in accordance with an embodiment. As shown in FIG. 10, circuit 400 may generally take the same form as circuit 100 of FIG. 3, with an opamp 110 coupled to an output stage formed of PMOS P4 and NMOS N4. For ease of illustration, the RC network of the filter is not shown. FIG. 10 further illustrates details of control circuit 120. As illustrated, control circuit 120 includes several current sources $I_B$ and $I_R$, a replica output device N5 and a current adjustment circuit 410.

In the embodiment of FIG. 10, the filtered output signal is output from the commonly coupled drain terminals of output stage devices PMOS P4 and NMOS N4 to a digital output pad 425, having a load capacitance CL coupled thereto. Current adjustment circuit 410 may control the gate voltage of PMOS P4, based on a feedback signal received from replica NMOS N5. In the embodiment of FIG. 10, replica NMOS N5 includes a drain terminal coupled to current source $I_R$ and a gate terminal commonly coupled with the gate terminal of NMOS N4. In turn, replica NMOS N5 provides a feedback signal to current adjustment circuit 410.

A current source $I_B$ also couples to current adjustment circuit 410. In operation, current adjustment circuit 410 may, based on the received feedback signal, reduce the amount of shoot-through current in the output stage. As described above, this control may be effected by controlling the gate voltage of PMOS P4 in a manner to control the current (Ip and In) flowing through output stage devices P4/N4. Understand that a control circuit can take other forms in different embodiments.

Figure 11:
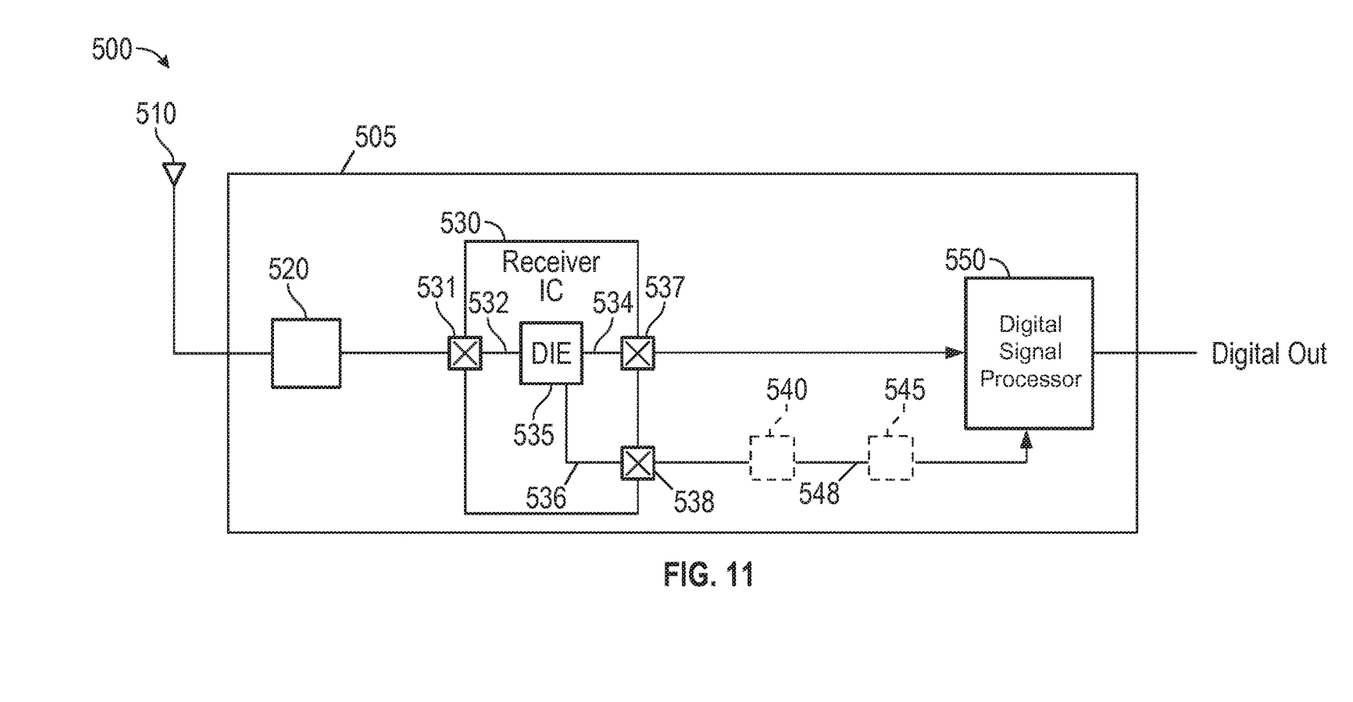
FIG. 11 is a block diagram of a portion of a system in accordance with an embodiment.

Referring now to FIG. 11, shown is a block diagram of a portion of a system in accordance with an embodiment. As shown in FIG. 11 a system 500 may be a radio receiver or other computing device having RF input capabilities. More specifically, in one embodiment system 500 may be an automotive radio tuner having an antenna 510 to receive RF signals and provide them to analog front end circuitry 520, implemented on a circuit board 505. Such front end circuitry may include filter circuitry, attenuation circuitry or so forth. In turn, minimally processed RF signals are provided to a receiver IC 530. More specifically, the RF signal is coupled to receiver IC 530 via an input pad 531. In turn, input pad 531 couples to a die 535 of the IC via a first bond wire 532. Various RF and other signal processing can be performed on the incoming RF signal to generate, e.g., a digitally processed signal that in turn is output from die 535 and via a bond wire 534 to an output pad 537. In accordance with embodiments as described herein, understand that an analog filter may be implemented on die 535 to enable reduced noise of this processed signal.

Assume further that a digital clock is generated on die 535 and output (via a bond wire 536) to another output pin 538. Understand that in various embodiments, die 535 may implement an output driver as described herein having a filter to enable this digital clock signal to be output with reduced interference to the RF signal received on pad 531.

In the embodiment shown, the digitally processed signal output from receiver IC 530 may couple to a digital signal processor 550 where additional signal processing may be performed, to enable output of a given digital output. As further shown, the digital clock signal is also provided to digital signal processor 550. Note that by using a filter as described herein, the need for buffer circuits 540 and 545 (e.g., to reduce capacitance) can be avoided. Instead, the digital clock signal may couple directly from digital output pad 538 to an input pad of digital signal processor 550 via a trace 548 of circuit board 505, without the need for buffers or other interposed circuitry. In this way, a system can be designed with fewer components, and smaller size and cost. Understand while shown at this high level in the embodiment of FIG. 11, many variations and alternatives are possible. Understand further that the output driver described herein can be used in many different types of integrated circuits.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a filter to receive a digital input signal via a first input signal path and output a driving signal via an output signal path, the filter having a feedback input coupled to the output signal path;
   an output stage coupled to the filter, the output stage comprising:
   a first metal oxide semiconductor field effect transistor (MOSFET) having a gate terminal to receive the driving signal and a second terminal to output a filtered signal; and
   a second MOSFET having a gate terminal to receive a control signal and a second terminal coupled to the second terminal of the first MOSFET; and
   a digital output pad coupled to the output signal path to output the filtered signal, the filtered signal comprising a digital signal.

2. The apparatus of claim 1, further comprising a first input pad to receive a radio frequency (RF) signal and to provide the RF signal to a signal processing path, the filter to reduce coupling of an impulse current of the filtered signal into the first input pad.

3. The apparatus of claim 1, wherein the apparatus is to prevent the filtered signal from rail-to-rail swinging.

4. The apparatus of claim 1, wherein the filter comprises an operational amplifier and a low pass filter.

5. The apparatus of claim 4, further comprising a feedback loop comprising:
   a first capacitor coupled between an output of the filter and a first input terminal of the filter;
   a first resistor coupled to a second resistor at a first node, the second resistor coupled to the first input terminal of the filter, and a third resistor coupled between the output of the filter and the first node; and
   a second capacitor coupled between the first node and a reference voltage node.

6. The apparatus of claim 1, further comprising a smoothing circuit to condition the digital input signal and provide the conditioned digital input signal to the filter.

7. The apparatus of claim 1, further comprising a control circuit to generate the control signal, based on an output current of the output stage.

8. The apparatus of claim 1, further comprising a control circuit to generate the control signal, based on the filtered signal at the gate terminal of the first MOSFET.

9. The apparatus of claim 8, wherein the control circuit is to generate the control signal to limit a current flow through the second MOSFET, responsive to the output current of the output stage being greater than a predetermined threshold.

10. The apparatus of claim 8, wherein the control circuit is to generate the control signal to maintain the output current of the output stage at a predetermined level.

11. An integrated circuit comprising:
   a driver to drive a digital output pad, the driver including an active filter having a first input to receive an input signal, a second input to couple to a reference voltage level, and an output to output a drive signal;
   an output stage including a first metal oxide semiconductor field effect transistor (MOSFET) and a second MOSFET, the output stage coupled to receive the drive signal and based at least in part thereon, to output a filtered signal to the digital output pad;
   a conductive path to couple the output stage to the digital output pad; and
   a control circuit to limit shoot-through current in the output stage.

12. The integrated circuit of claim 11, wherein the control circuit is to generate a control signal to control the second MOSFET to limit the shoot-through current in the output stage.

13. The integrated circuit of claim 11, wherein the first input of the active filter further comprises a feedback input to receive the filtered signal as a feedback signal.

14. The integrated circuit of claim 13, wherein the active filter comprises an operational amplifier having the first input and the second input.

15. The integrated circuit of claim 11, wherein the integrated circuit further comprises a radio frequency input to receive radio frequency signals.

16. A system comprising:
   a first integrated circuit (IC) including:
      a first input pad to receive a radio frequency (RF) signal;
      a radio receiver to process and downconvert the RF signal and an analog-to-digital converter (ADC) to receive the downconverted RF signal and output a digitally processed signal to a second IC;
      a filter to receive a digital signal via an input signal path and output a drive signal via an output signal path, the filter having a feedback loop coupled between the output signal path and a feedback input of the filter, the digitally processed signal a different signal than the digital signal; and
      a first output pad coupled to the output signal path to output a filtered digital signal based on the drive signal.

17. The system of claim 16, further comprising:
   the second IC to receive and process the digitally processed signal; and
   a circuit board having the first IC and the second IC adapted thereto, the circuit board comprising a trace to directly couple the first output pad of the first IC to an input pad of the second IC without interposition of a buffer.

18. The system of claim 17, further comprising:
   an output stage coupled to the filter to receive the drive signal and output the filtered digital signal; and
   a control circuit coupled to the output stage to control the filtered digital signal from substantially reaching either a power supply voltage level or a ground voltage level.

19. The system of claim 16, wherein the filter is to substantially reduce frequency content of the digital signal in a frequency band of the RF signal.

* * * * *